United States Patent
Zeng

(10) Patent No.: US 9,095,082 B2
(45) Date of Patent: Jul. 28, 2015

(54) METHOD FOR MANUFACTURING MULTILAYER PRINTED CIRCUIT BOARD

(75) Inventor: Hui Zeng, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 938 days.

(21) Appl. No.: 13/181,453

(22) Filed: Jul. 12, 2011

(65) Prior Publication Data

US 2012/0011713 A1 Jan. 19, 2012

(30) Foreign Application Priority Data

Jul. 13, 2010 (CN) .......................... 2010 1 0224861

(51) Int. Cl.
  H05K 3/00 (2006.01)
  H05K 3/36 (2006.01)
  H05K 3/02 (2006.01)
  H05K 1/00 (2006.01)
  H05K 3/46 (2006.01)
  H05K 3/42 (2006.01)

(52) U.S. Cl.
  CPC .............. *H05K 3/4635* (2013.01); *H05K 3/429* (2013.01); *H05K 2201/055* (2013.01); *H05K 2203/0228* (2013.01); *H05K 2203/1545* (2013.01); *Y10T 29/49124* (2015.01)

(58) Field of Classification Search
  CPC ................. H01L 2924/01079; H05K 13/0486; H05K 2201/0355; H05K 1/0393
  USPC .............................. 29/829, 830, 847; 174/254
  See application file for complete search history.

(56) References Cited

U.S. PATENT DOCUMENTS

| | | | | |
|---|---|---|---|---|
| 5,105,055 A * | 4/1992 | Mooney et al. | ................... | 174/27 |
| 5,144,742 A * | 9/1992 | Lucas et al. | ..................... | 29/830 |
| 5,262,594 A * | 11/1993 | Edwin et al. | .................. | 174/254 |
| 5,313,096 A * | 5/1994 | Eide | .............. | 257/686 |
| 5,499,444 A * | 3/1996 | Doane et al. | ..................... | 29/830 |
| 5,612,570 A * | 3/1997 | Eide et al. | ....................... | 257/686 |
| 5,712,607 A * | 1/1998 | Dittmer et al. | ................ | 333/238 |
| 5,724,012 A * | 3/1998 | Teunisse | ...................... | 333/238 |
| 5,795,162 A * | 8/1998 | Lambert | ........................ | 439/63 |
| 5,950,304 A * | 9/1999 | Khandros et al. | ............... | 29/831 |
| 6,323,060 B1 * | 11/2001 | Isaak | ............................. | 438/109 |
| 6,426,240 B2 * | 7/2002 | Isaak | ............................. | 438/106 |
| 6,514,793 B2 * | 2/2003 | Isaak | ............................. | 438/109 |
| 6,518,864 B1 * | 2/2003 | Ito et al. | .......................... | 333/238 |
| 7,663,064 B2 * | 2/2010 | Dutta et al. | .................... | 174/261 |
| 2014/0182900 A1 * | 7/2014 | Hou | .............................. | 174/254 |
| 2014/0216792 A1 * | 8/2014 | Sebanz et al. | ................. | 174/254 |

FOREIGN PATENT DOCUMENTS

| JP | 2004-311833 | | 11/2004 |
|---|---|---|---|
| JP | 2007-180421 | | 7/2007 |
| JP | 2007-180421 A | * | 7/2007 |

* cited by examiner

*Primary Examiner* — David Angwin

(74) *Attorney, Agent, or Firm* — Novak Druce Connolly Bove + Quigg LLP

(57) ABSTRACT

In a method for manufacturing multilayer PCBs having n circuit layers, a flexible substrate strip is provided. The strip comprises a number of PCB units, each comprising n segmental portions. The strip is treated in a reel to reel process to form traces in n−2 segmental portions of each of the PCB units, the other two segmental portions are left untreated without traces. Then the strip is cut to obtain a number of separated PCB units. The PCB unit is folded in such a manner that the n−2 segmental portions having traces are arranged between the other two segmental portions without traces. The folded PCB unit is laminated to form a multilayer substrate and traces are formed in the two segmental portions.

14 Claims, 21 Drawing Sheets

```
┌─────────────────────────────────────────────┐
│ providing a flexible substrate, which comprises a │
│ plurality of PCB units, each of the PCB units │
│ comprising n conductor units connected along a │
│ lengthwise direction of the flexible substrate │
└─────────────────────────────────────────────┘
                      │
┌─────────────────────────────────────────────┐
│ using roll to roll process to form traces at n-2 │
│ conductor units of each of the PCB units     │
└─────────────────────────────────────────────┘
                      │
┌─────────────────────────────────────────────┐
│ cutting the substrate along a boundary line of each │
│ of the PCB units to obtain the PCB units separated │
│ from each other                              │
└─────────────────────────────────────────────┘
                      │
┌─────────────────────────────────────────────┐
│ folding each of the PCB units in such a manner that │
│ the n-2 conductor units having traces are arranged │
│ between the other two conductor units without of │
│ traces                                       │
└─────────────────────────────────────────────┘
                      │
┌─────────────────────────────────────────────┐
│ laminating the folded PCB units to form a    │
│ laminated multilayer substrates              │
└─────────────────────────────────────────────┘
                      │
┌─────────────────────────────────────────────┐
│ forming traces at the two conductor units of the │
│ laminated multilayer substrate               │
└─────────────────────────────────────────────┘
```

FIG. 1

METHOD FOR MANUFACTURING MULTILAYER PRINTED CIRCUIT BOARD

BACKGROUND

1. Technical Field

The present disclosure generally relates to technology of manufacturing printed circuit boards (PCBs), and particularly, to a method for manufacturing a number of multilayer PCBs.

2. Description of Related Art

Multilayer PCBs are widely used in various electronic devices such as mobile phones, printers, and hard disk drives. Multilayer PCBs are manufactured by panel process and build-up process. For example, a six-layer PCB would be manufactured by the following steps. Firstly, a double-sided substrate having traces is provided. Then two single-sided substrates are attached to two opposite sides of the double-sided substrate, respectively, to form a four-layer substrate. After the two single-sided substrates are etched to form traces, another two single-sided substrates are attached to two opposite sides of the four-layer substrate, respectively, to form a six-layer substrate. Then the two single-sided substrates are etched to form traces. However, during the above, several etching steps are required to form traces in the different layers. That is, a long time is needed to manufacture the multilayer PCB, and accuracy may be lacking in the traces formed this way.

What is needed, therefore, is a method for manufacturing multilayer PCBs that overcomes the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

FIG. 1 is a flowchart of a process for manufacturing multilayer flexible PCBs in accordance with an exemplary embodiment.

DETAILED DESCRIPTION

Embodiments will now be described in detail below and with reference to the drawings.

Described below is a method for manufacturing multilayer flexible PCBs, wherein each comprises n circuit layers, n represents an integer greater than 2, and the method includes the steps of:

(1) providing a flexible substrate strip, the flexible substrate strip comprising a plurality of PCB units, each PCB units comprising n segmental portions connected sequentially along a lengthwise direction of the flexible substrate strip;

(2) forming traces in n–2 segmental portions of each PCB unit in a reel to reel process, the remaining 2 segmental portion being left untreated without traces;

(3) cutting the substrate strip along border lines between the PCB units to separate the PCB units from each other;

(4) folding each PCB unit in such a manner that the n–2 segmental portions having traces are folded and arranged between the remaining two segmental portions;

(5) laminating each folded PCB unit to form a plurality of laminated multilayer substrate; and (6) forming traces in the remaining two segmental portions.

Referring to FIGS. 1-9, a method for manufacturing three-layer flexible PCBs provided in a first embodiment includes the following steps.

Figure 2:
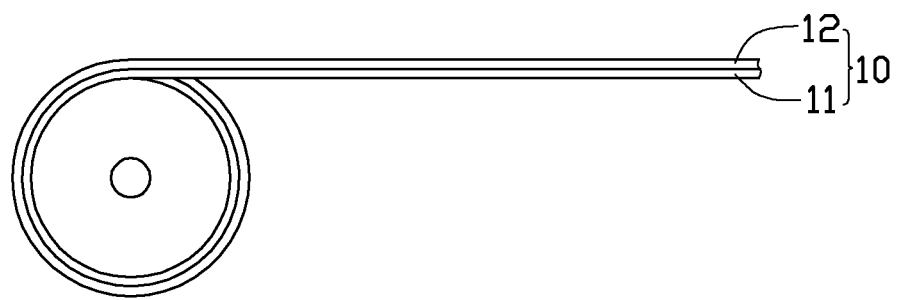
FIG. 2 is a sectional view of a flexible substrate strip provided in a first embodiment.
Figure 3:
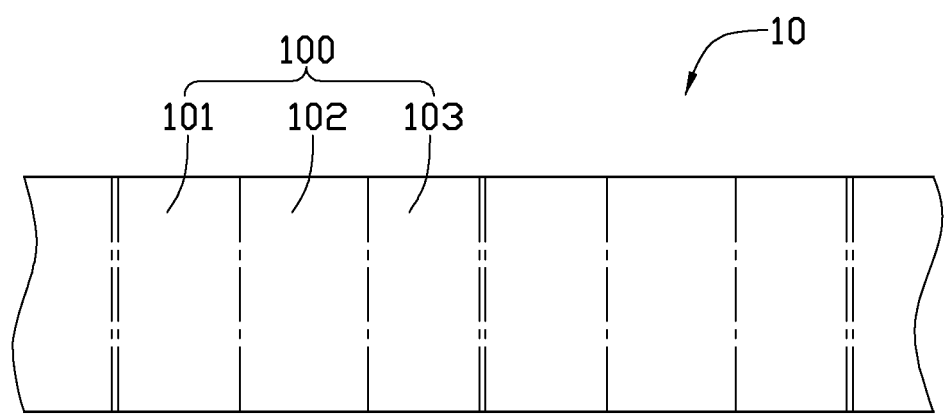
FIG. 3 is a top view of the flexible substrate strip of FIG. 2, wherein the flexible substrate strip includes a number of PCB units, the PCB units each includes a first, a second, and a third segmental portions.

Referring to FIGS. 2 and 3, in step (1), a flexible substrate strip 10 wound around two spools is provided. In the illustrated embodiment, the strip 10 is single-sided copper clad laminate (single-sided CCL), and includes an insulation layer 11 and a copper layer 12. The insulation layer 11 is comprised of flexible material, such as polyimide, polyethylene terephthalate, and polyethylene naphthalate. The strip 10 includes a number of PCB units 100 connected sequentially along a lengthwise direction of the strip 10. Border lines between the PCB units 100 are substantially parallel to each other and substantially perpendicular to a length of the strip 10.

Each of the PCB units 100 can be formed into a three-layer PCB. In the illustrated embodiment, the PCB units 100 each include a first segmental portion 101, a second segmental portion 102, and a third segmental portion 103 connected sequentially along a lengthwise direction of the strip 10, wherein the second segmental portion 102 interconnects the first and third segmental portions 101 and 103. The segmental portions 101 through 103 have a same size. Border lines between the segmental portions are also substantially parallel to each other and substantially perpendicular to a length of the strip 10.

Figure 4:
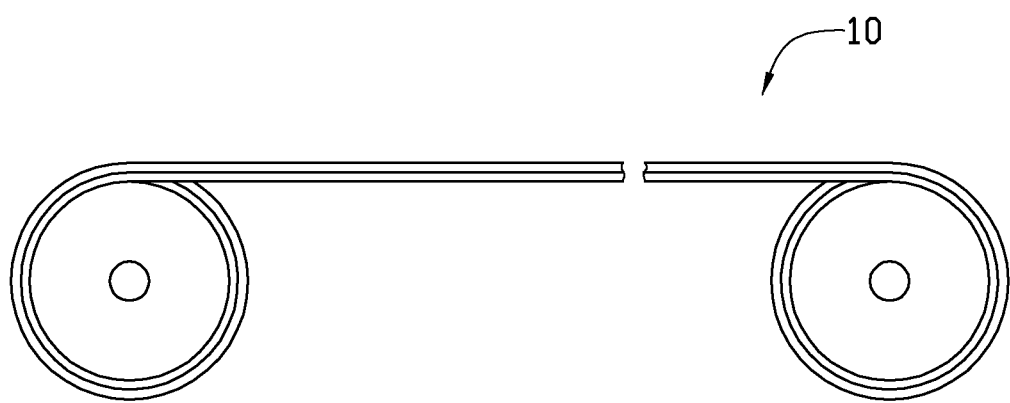
FIG. 4 is a schematic view of processing the flexible substrate strip of FIG. 2 using reel to reel technology.
Figure 5:
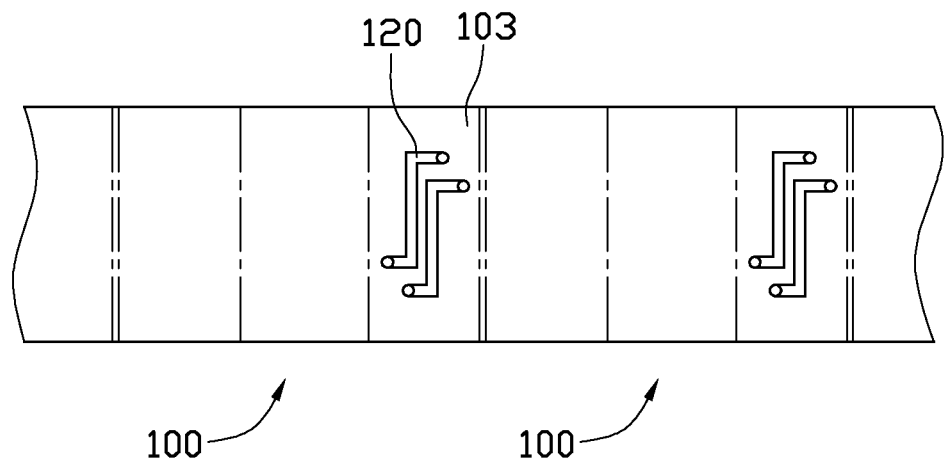
FIG. 5 is similar to FIG. 3, but shows traces being formed at the third segmental portion.

Referring to FIGS. 4 and 5, in step (2), the strip 10 is treated in a reel to reel process to form traces 120 in the third segmental portion 103 with remaining the first and second segmental portions 101 and 102 left untreated. The traces 120 of the third segmental portion 103 can be obtained by etching the copper layer 12 of the third segmental portion 103 of the strip 10 using a chemical solution or laser beam, as is well known in the art.

Treating the strip 10 includes the following substeps. First, the strip 10 is unwound from one spool. Then the unwound portion in between the spools is treated such that the copper layers 12 of the third segmental portions 103 located between the spools are formed into the traces. And the treated unwound portion is fed and wound onto another spool.

Figure 6:
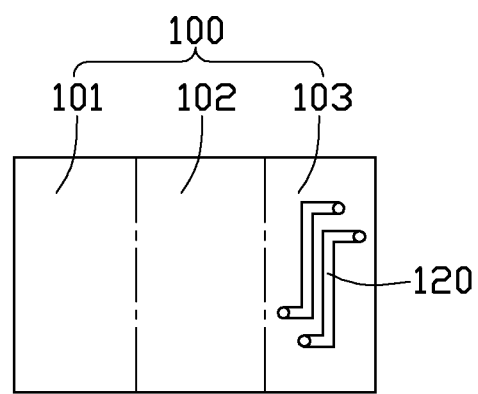
FIG. 6 is similar to FIG. 5, but shows the flexible substrate strip divided into a number of separate PCB units.

Referring to FIG. 6, in step (3), the strip 10 is cut along border lines between the PCB units 100, to obtain separated PCB units 100. In the illustrated embodiment, the strip 10 is cut along border lines between each two adjacent PCB units 100.

Figure 7:
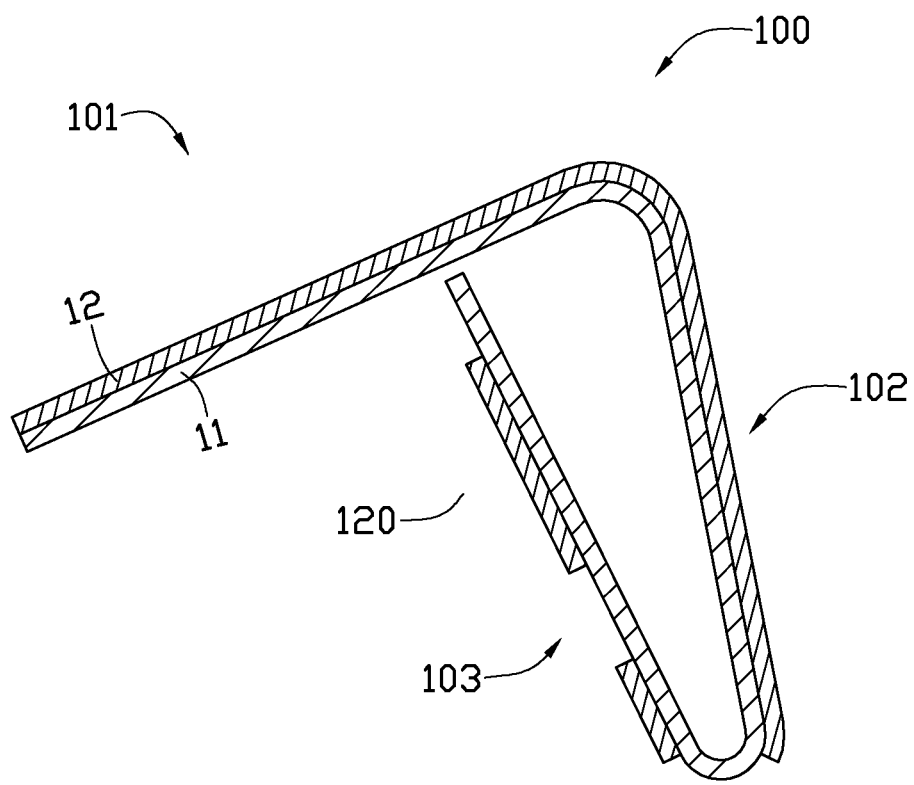
FIG. 7 is a schematic view of folding the PCB unit of FIG. 6.

Referring to FIG. 7, in step (4), each of the separated PCB units 100 is folded along border lines between each two adjacent segmental portions. In the illustrated embodiment, the PCB unit 100 is folded along a border line between the first and second segmental portions 101 and 102 and along a border line between the second and third segmental portions 102 and 103, leaving the third segmental portion 103 disposed between the first and second segmental portions 101 and 102. Specifically, the insulation layer 11 of the third segmental portion 103 is adjacent to the insulation layer 11 of the second segmental portion 102, and the traces 120 of the third segmental portion 103 are adjacent to the insulation layer 11 of the first segmental portion 101. Due to the flexibility of the insulation layer 11, the PCB unit 100 can be folded in such a manner that the segmental portions 101 through 103 are substantially parallel to each other.

Figure 8:
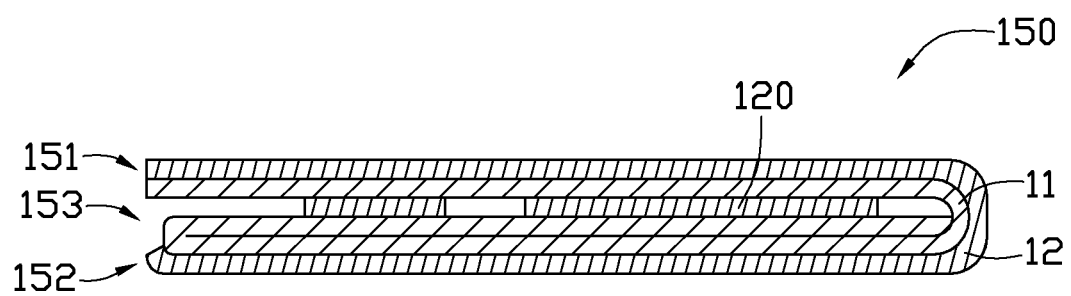
FIG. 8 is a schematic view of laminating the folded PCB unit of FIG. 7.

Referring to FIG. 8, in step (5), each of the folded PCB units 100 is laminated to form a three-layer substrate 150. During the lamination process, the insulation layer 11 reacts to the heat and binds the first, second, and third segmental portions 101, 102, and 103.

The three-layer substrate 150 includes a first outer substrate 151, a second outer substrate 152, and an inner substrate 153 laminated sandwiched between the first and second outer substrates 151 and 152. The first outer substrate 151 consists of the first segmental portion 101, the second outer substrate 152 consists of the second segmental portion 102, and the inner substrate 153 consists of the third segmental portion 103. That is, the first outer substrate 151, the second outer substrate 152, and the inner substrate 153 each are single-layer substrates. The traces 120 of the third segmental portion 103 form a circuit layer of the three-layer substrate 150. The copper layer 12 of the first and second segmental portions 101 and 102 is exposed to the exterior.

Figure 9:
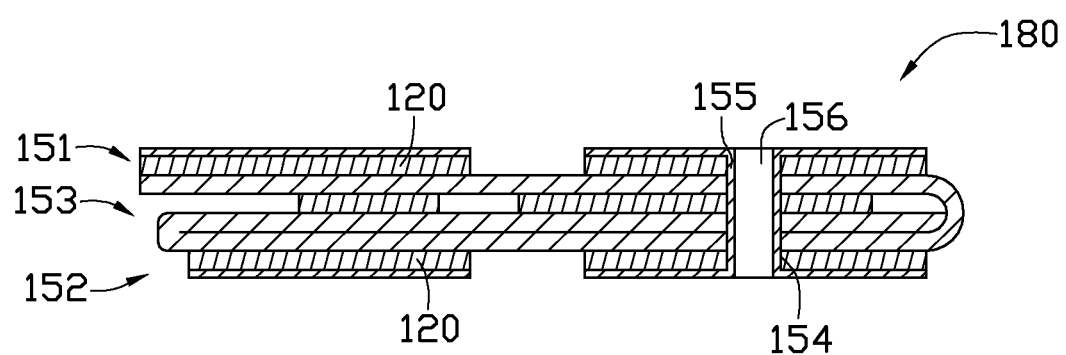
FIG. 9 is a schematic view of a three-layer PCB.

Referring to FIG. 9, in step (6), the three-layer substrate 150 is manufactured to be a three-layer PCB 180. Traces 120 are formed at the first and second segmental portions 101 and 102, i.e., the first and second outer substrates 151 and 152, in a panel process. The traces 120 of each of the segmental portions 101 to 103 form one circuit layer of the three-layer PCB 180. The circuit layers can be electrically connected with each other by via holes.

In the illustrated embodiment, the method of manufacturing the three-layer PCB 180 from the three-layer substrate 150 includes the following steps. First, a through hole 154 is formed in the three-layer substrate 150. Then the three-layer substrate 150 is processed using an electroless plating technology and electroplating technology to form a coating on the sidewall of the through hole 154, on the surface of the copper layer 12 of the first outer substrate 151, and on the surface of the copper layer 12 of the second outer substrate 152. Thus, a plated through hole 156 is obtained to electrically connect the traces 120 of the inner substrate 153, the copper layer 12 of the first outer substrate 151, and the copper layer 12 of the second outer substrate 152 together. Finally, traces 120 are formed at the first and second outer substrates 151 and 152 by etching the copper layer 12 of the first and second outer substrates 151 and 152.

In the above-mentioned steps, it is understood that the copper layer 12 of each of the three segmental portions of the PCB unit 100 is processed to form one circuit layer of the three-layer PCB 180, and the three circuit layers of the three-layer PCB 180 are electrically connected with each other by the plated through hole 156.

In addition, coverlays can be used over the traces 120 of the first and second outer substrates 151 and 152 to protect the traces 120.

Referring to FIGS. 10-15, a method for manufacturing four-layer flexible PCBs provided in a second embodiment includes the following steps.

Figure 10:
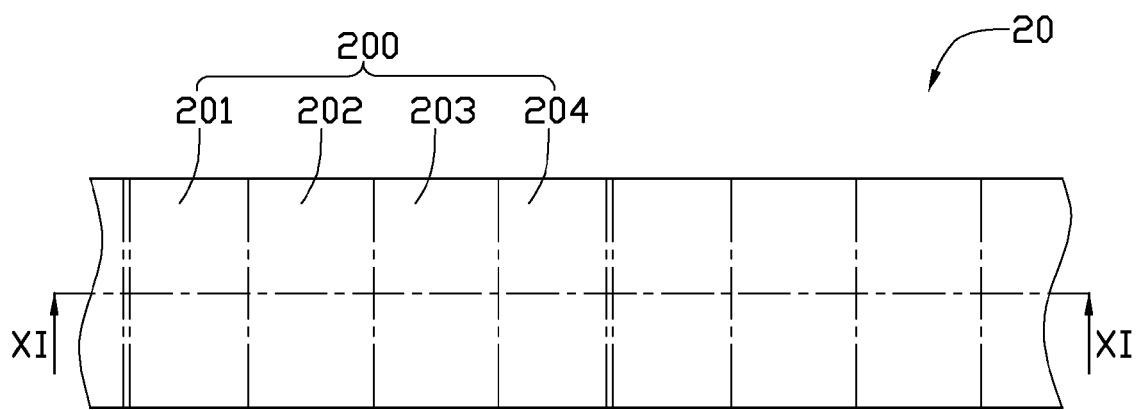
FIG. 10 is a sectional view of a flexible substrate strip provided in a second embodiment, wherein the flexible substrate strip includes a number of PCB units, the PCB units each includes a first, a second, a third, and a fourth segmental portions.
Figure 11:
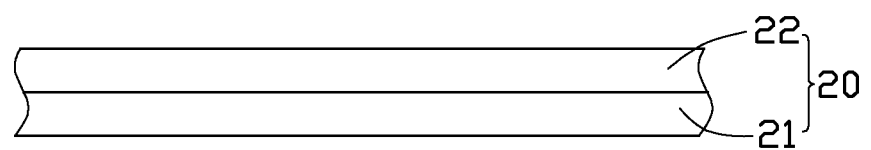
FIG. 11 is a sectional view of the flexible substrate strip along line XI-XI of FIG. 10.

Referring to FIGS. 10 and 11, in step (1), a flexible substrate strip 20 is provided. The strip 20 is similar to the strip 10 of the first embodiment, and includes an insulation layer 21 and a copper layer 22. The strip 20 includes a number of PCB units 200 connected sequentially along a lengthwise direction of the strip 20. Each of the PCB units 200 can be formed into a four-layer PCB. In the illustrated embodiment, the PCB units 200 each include a first segmental portion 201, a second segmental portion 202, a third segmental portion 203, and a fourth segmental portion 204 connected sequentially along a lengthwise direction of the strip 20, wherein the second segmental portion 202 interconnects the first and third segmental portions 201 and 203, the third segmental portion 203 interconnects the second and fourth segmental portions 202 and 204.

Figure 12:
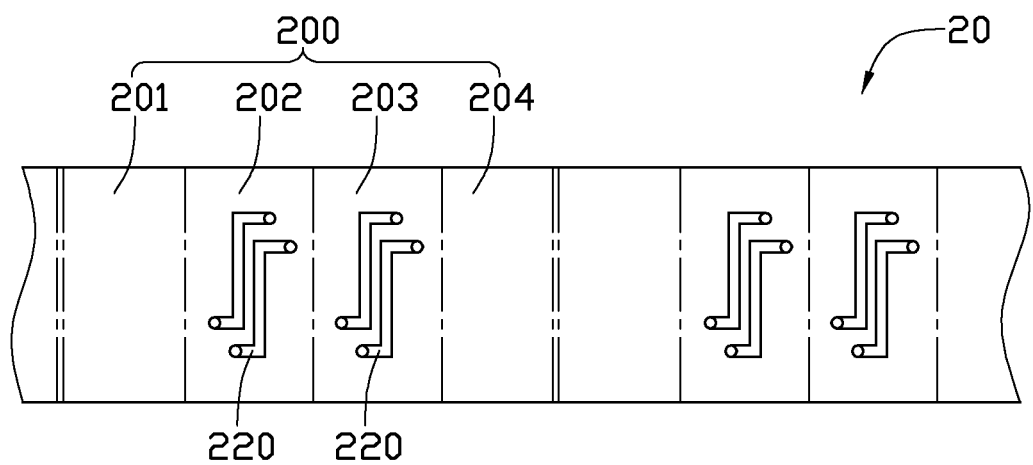
FIG. 12 is similar to FIG. 10, but shows traces formed at the second and third segmental portions.

Referring to FIG. 12, in step (2), the strip 20 is treated in a reel to reel process to form traces 220 at the second and third segmental portions 202 and 203. The first and fourth segmental portions 201 and 204 are left untreated without traces 220. The traces 220 of the second and third segmental portions 202 and 203 can be obtained by etching the copper layer 22 of the second and third segmental portions 202 and 203 of the strip 20.

Figure 13:
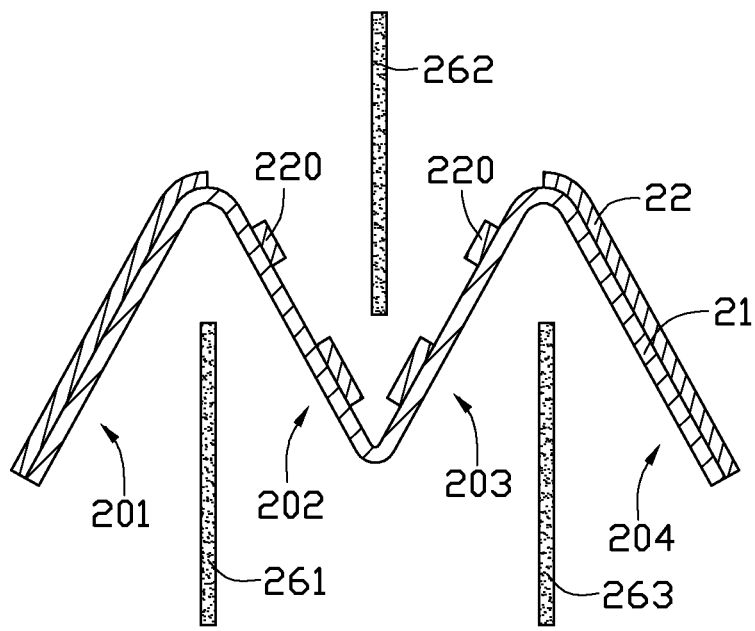
FIG. 13 is a schematic view of folding the PCB unit of FIG. 12.

Referring to FIGS. 12 and 13, in step (3), the strip 20 is cut along border lines between the PCB units 200 to obtain separated PCB units 100. In the illustrated embodiment, the strip 20 is cut along border lines between each two adjacent PCB units 200.

Figure 14:
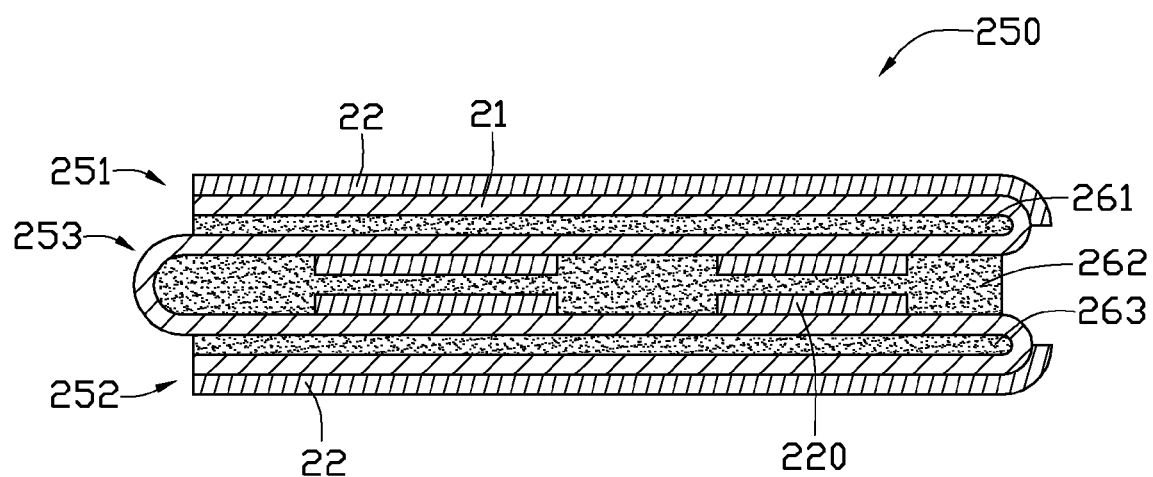
FIG. 14 is a schematic view of laminating the folded PCB unit of FIG. 13.

Referring to FIGS. 13 and 14, in step (4), each of the separated PCB units 200 is folded along border lines between each two adjacent segmental portions in such a manner that the second segmental portion 202 is disposed between the first and third segmental portions 201 and 203, and the third segmental portion 203 is disposed between the second and fourth segmental portions 203 and 204. Due to the flexibility of the insulation layer 21, the PCB unit 200 can be folded in such a manner that the segmental portions 201 through 204 are substantially parallel to each other.

Referring to FIGS. 13 and 14, in step (5), three adhesive sheets are provided and each laminated between two adjacent segmental portions to form a four-layer substrate 250. In detail, a first adhesive sheet 261 is disposed between the insulation layer 21 of the first segmental portion 201 and the insulation layer 21 of the second segmental portion 202, a second adhesive sheet 262 is disposed between the traces 220 of the second segmental portion 202 and the traces 220 of the third segmental portion 203, a third adhesive sheet 263 is disposed between the insulation layer 21 of the third segmental portion 203 and the insulation layer 21 of the fourth segmental portion 204. Then the folded PCB unit 200 and the adhesive sheets 261 through 263 are laminated together to form a four-layer substrate 250. During the laminating process, the adhesive sheets 261 through 263 flow to fill the gaps between the traces 220 and bind the segmental portions 201 through 204.

The four-layer substrate 250 includes a first outer substrate 251, a second outer substrate 252, and an inner substrate 253 sandwiched between the first and second outer substrates 251 and 252. The first outer substrate 251 consists of the first segmental portion 201 and the first adhesive sheet 261. The second outer substrate 252 consists of the fourth segmental portion 204 and the third adhesive sheet 263. The inner substrate 253 consists of the second segmental portion 202, the third segmental portion 203, and the second adhesive sheet 262. The traces 220 of the second segmental portion 202 and the traces 220 of the third segmental portion 203 each form one circuit layer of the inner substrate 253. That is, both of the first and second outer substrates 251 and 252 are single-layer substrates, and the inner substrate 253 is a double-layer substrate. The copper layer 22 of the first outer substrate 251 and the copper layer 22 of the second outer substrate 252 are exposed to the exterior.

Figure 15:
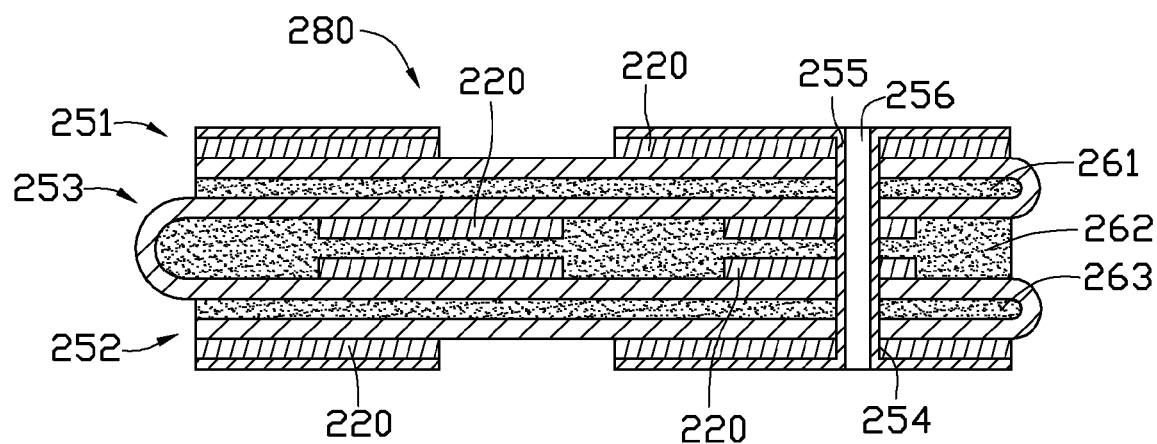
FIG. 15 is a schematic view of an obtained four-layer PCB.

Referring to FIGS. 14 and 15, in step (6), the four-layer substrate 250 is manufactured to be a four-layer PCB 280. Traces 220 are formed at the first and fourth segmental portions 201 and 204. The traces 220 of each of the segmental portions 201 through 204 consist one circuit layer of the four-layer PCB 280. The circuit layers can be electrically connected with each other by via holes.

In the illustrated embodiment, the method of manufacturing the four-layer PCB 280 from the four-layer substrate 250 includes the following steps. First, a through hole 254 is formed in the four-layer substrate 250. Then the four-layer substrate 250 is processed using an electroless plating technology and electroplating technology to form a coating on the sidewall of the through hole 254, on the surface of the copper layer 22 of the first outer substrate 251, and on the surface of the copper layer 22 of the second outer substrate 252. Thus, a plated through hole 256 is obtained to electrically connect the traces 220 of the inner substrate 253, the copper layer 22 of the first outer substrate 251, and the copper layer 22 of the second outer substrate 252. Finally, traces 220 are formed at the first and second outer substrates 251 and 252 by etching the copper layer 22 thereof.

In the above-mentioned steps, it is understood that the copper layer 22 of each of the four segmental portions of the PCB unit 200 is processed to form one circuit layer of the four-layer PCB 280, and the circuit layers of the four-layer PCB 280 are electrically connected with each other by the plated through hole 256.

Referring to FIGS. 16-21, a method for manufacturing five-layer flexible PCBs provided in a third embodiment includes the following steps.

Figure 16:
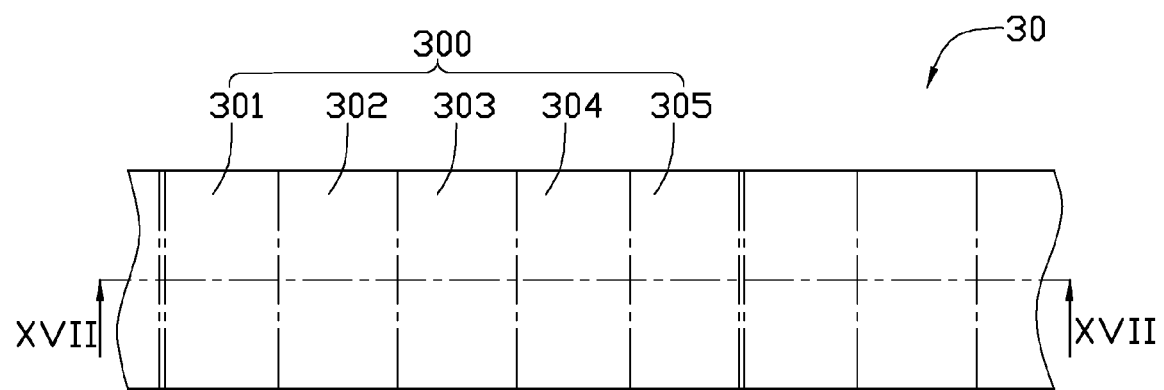
FIG. 16 is a sectional view of a flexible substrate strip provided in a third embodiment, wherein the flexible substrate strip includes a number of PCB units, the PCB units each includes a first, a second, a third, a fourth, and a fifth segmental portions.
Figure 17:
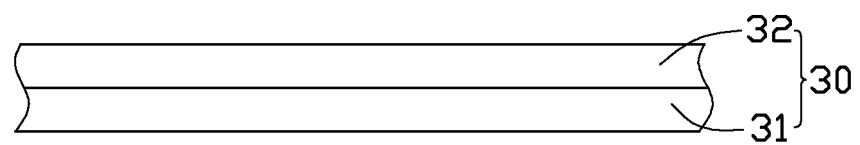
FIG. 17 is a sectional view of the flexible substrate strip along line XVII-XVII of FIG. 16.

Referring to FIGS. 16 and 17, in step (1), a flexible substrate strip 30 is provided. The strip 30 is similar to the strip 10 of the first embodiment, and includes an insulation layer 31 and a copper layer 32. The strip 30 includes a number of PCB units 300 connected sequentially along a lengthwise direction of the strip 30. Each of the PCB units 300 can be formed into a five-layer PCB. In the illustrated embodiment, the PCB units 300 each include a first segmental portion 301, a second segmental portion 302, a third segmental portion 303, a fourth segmental portion 304, and a fifth segmental portion 305 connected sequentially along a lengthwise direction of the strip 30, wherein the second segmental portion 302 interconnects the first and third segmental portions 301 and 303, the fourth segmental portion 304 interconnects the third and fifth segmental portions 303 and 305.

Figure 18:
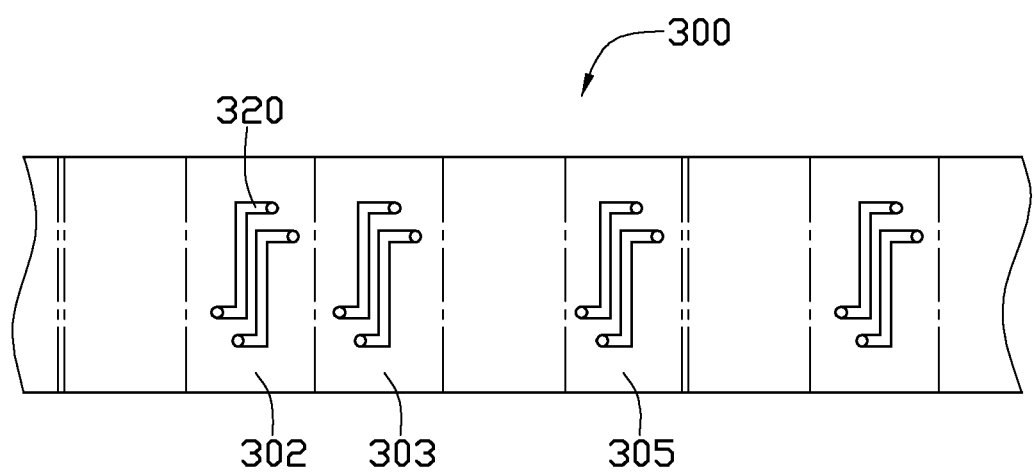
FIG. 18 is similar to FIG. 16, but shows traces formed at the second, third, and fifth segmental portions.

Referring to FIG. 18, in step (2), the strip 30 is treated using reel to reel process technology to form traces 320 at the second, third, and fifth segmental portions 302, 303, and 305. The traces 320 can be obtained by etching the copper layer 32 of the strip 30. The first and fourth segmental portions 301 and 304 are left untreated without traces 320.

Figure 19:
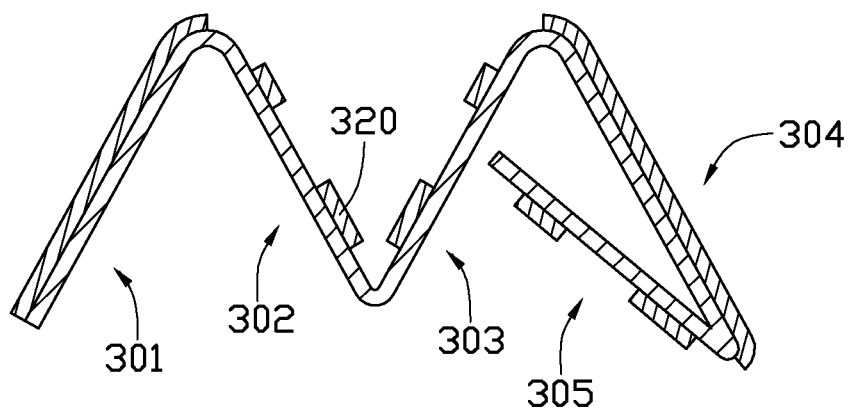
FIG. 19 is a schematic view of folding the PCB unit of FIG. 18.

Referring to FIGS. 18 and 19, in step (3), the strip 30 is cut along border lines between the PCB units 300 to obtain separated PCB units 300. In the illustrated embodiment, the strip 30 is cut along border lines between each two adjacent PCB units 300.

Referring to FIG. 19, in step (4), each of the separated PCB units 300 is folded along border lines between each two adjacent segmental portions in such a manner that the second segmental portion 302 is disposed between the first and third segmental portions 301 and 303, the third segmental portion 303 is disposed between the second and fifth segmental portions 302 and 305, and the fifth segmental portion 305 is disposed between the third and fourth segmental portions 303 and 304. Due to the flexibility of the insulation layer 31, the PCB unit 300 can be folded in such a manner that the segmental portions 301 through 305 are substantially parallel to each other.

Figure 20:
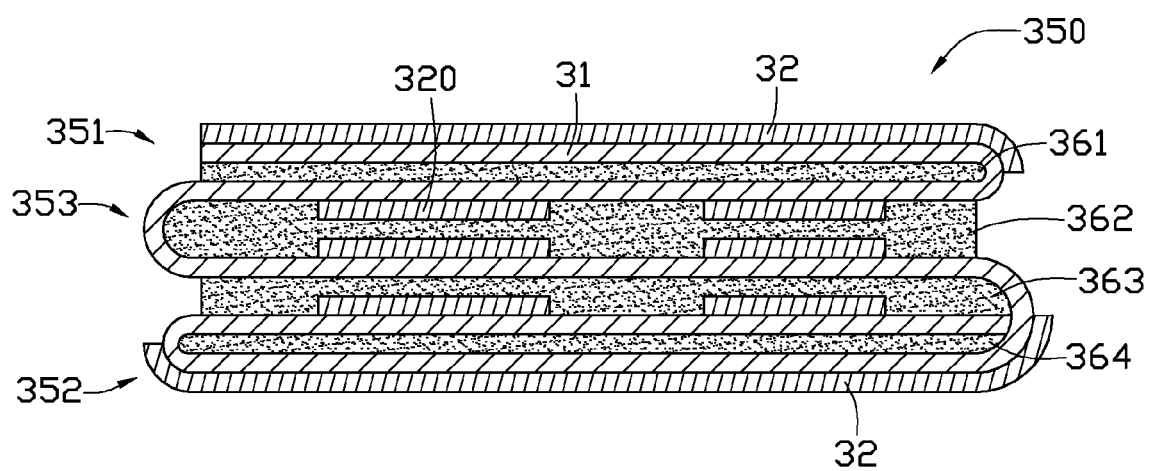
FIG. 20 is a schematic view of laminating the folded PCB unit of FIG. 19.

Referring to FIGS. 19 and 20, in step (5), four adhesive sheets are provided and each laminated between two adjacent segmental portions to form a five-layer substrate 350. In detail, a first adhesive sheet 361 is disposed between the insulation layer 31 of the first segmental portion 301 and the insulation layer 31 of the second segmental portion 302, a second adhesive sheet 362 is disposed between the traces 320 of the second segmental portion 302 and the traces 320 of the third segmental portion 303, a third adhesive sheet 363 is disposed between the insulation layer 31 of the third segmental portion 303 and traces 320 of the fifth segmental portion 305, a fourth adhesive sheet 364 is disposed between the insulation layer 31 of the fifth segmental portion 305 and the insulation layer 31 of the fourth segmental portion 304. Then the folded PCB unit 300 and the adhesive sheets 361 through 364 are laminated together to form a five-layer substrate 350. During the laminating process, the adhesive sheets 361 through 364 flow to fill the gaps between the traces 320 and bind the segmental portions 301 through 305.

The five-layer substrate 350 includes a first outer substrate 351, a second outer substrate 352, and an inner substrate 353 sandwiched between the first and second outer substrates 351 and 352. The first outer substrate 351 consists of the first segmental portion 301 and the first adhesive sheet 361. The second outer substrate 352 consists of the fourth segmental portion 304 and the fourth adhesive sheet 364. The inner substrate 353 consists of the second segmental portion 302, the third segmental portion 303, the fifth segmental portion 305, the second adhesive sheet 362, and the third adhesive sheet 363. That is, both of the first and second outer substrates 351 and 352 are single-layer substrates, and the inner substrate 353 is a three-layer substrate. The copper layer 32 of the first outer substrate 351 and the copper layer 32 of the second outer substrate 352 are exposed to the exterior.

Figure 21:
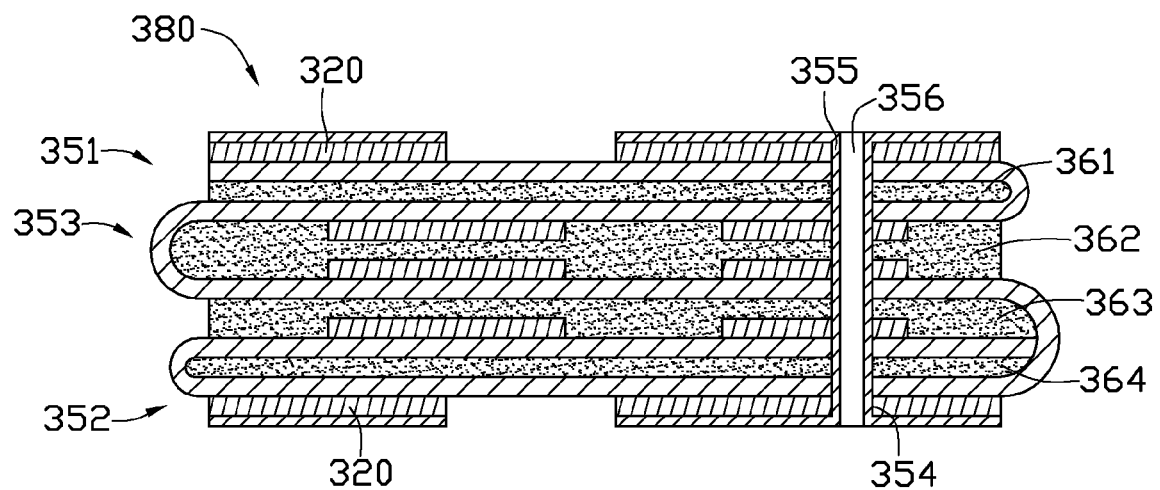
FIG. 21 is a schematic view of an obtained five-layer PCB.

Referring to FIGS. 20 and 21, in step (6), the five-layer substrate 350 is manufactured to be a five-layer PCB 380. Traces 320 are formed at the first and fourth segmental portions 301 and 304. The traces 320 of each of the segmental portions 301 through 305 consist one circuit layer of the five-layer PCB 380. The circuit layers can be electrically connected with each other by via holes.

In the illustrated embodiment, the method of manufacturing the five-layer PCB 380 from the five-layer substrate 350 includes the following steps. First, a through hole 354 is formed in the five-layer substrate 350. Then the five-layer substrate 350 is processed using an electroless plating technology and electroplating technology to form a coating on the sidewall of the through hole 354, on the surface of the copper layer 32 of the first outer substrate 351, and on the surface of the copper layer 32 of the second outer substrate 352. Thus, a plated through hole 356 is obtained to electrically connect the traces 320 of the inner substrate 353, the copper layer 32 of the first outer substrate 351, and the copper layer 32 of the second outer substrate 352. Finally, traces 320 are formed at the first and second outer substrates 351 and 352 by etching the copper layer 32.

In the above-mentioned steps, it is understood that the copper layer 32 of each of the five segmental portions of the PCB unit 300 is processed to form one circuit layer of the five-layer PCB 380, and the circuit layers of the five-layer PCB 380 are electrically connected with each other by the plated through hole 356.

In the above-mentioned steps, the circuit layers of the inner substrate 353 of a number of five-layer PCBs 380 can be formed simultaneously with the same accuracy using reel to reel process technology. As such, the efficiency of manufacture a number of five-layer PCB 380 is improved and the quality and functioning are reliable.

It is noted that six-layer PCBs, seven-layer PCBs, or any other multilayer PCBs can be manufactured by the method of the present disclosure, using steps similar to the above-mentioned steps.

It should be emphasized that the described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

The invention claimed is:

1. A method for manufacturing multilayer flexible PCBs, each of the flexible PCBs comprising n circuit layers, n representing an integer greater than 2, the method comprising:
   first, providing a flexible substrate strip, the flexible substrate strip comprising a plurality of PCB units, each PCB units comprising n segmental portions connected sequentially along a lengthwise direction of the flexible substrate strip;
   second, after the first step, forming traces in n−2 segmental portions of each PCB unit in a reel to reel process, the remaining two segmental portions left untreated without traces;
   third, after the second step, cutting the flexible substrate strip along border lines between the PCB units to separate the PCB units from each other;
   fourth, after the third step, folding each PCB unit in such a manner that the n−2 segmental portions having traces are arranged between the two segmental portions left untreated without traces;
   fifth, after the fourth step, laminating each folded PCB unit to form a plurality of laminated multilayer substrates; and
   sixth, after the fifth step, forming traces in the two segmental portions left untreated without traces.

2. The method of claim 1, wherein n−1 adhesive sheets are provided and each adhesive sheet is sandwiched between each two adjacent segmental portions in the laminating step.

3. The method of claim 1, wherein after the step of forming traces in the two segmental portions left untreated without traces, two coverlays are formed over the traces of the two segmental portions left untreated without traces, respectively.

4. The method of claim 1, wherein the flexible substrate strip is a copper clad laminate.

5. The method of claim 4, wherein the flexible substrate strip includes an insulation layer and a copper layer, and the traces are formed by etching the copper layer.

6. The method of claim 1, wherein the flexible substrate strip is cut along border lines between each two adjacent PCB units.

7. The method of claim 1, wherein each of the segmental portions are folded in a manner such that the segmental portions are substantially parallel with each other.

8. A method for manufacturing multilayer flexible PCBs, each of the flexible PCBs comprising n circuit layers, n representing an integer greater than 2, the method comprising:
   first, providing a flexible substrate strip wound around two spools, the flexible substrate strip comprising an insulating layer and a conductive layer formed on the insulating layer, the flexible substrate strip including a plurality of PCB units arranged along a lengthwise direction of the flexible substrate strip, each PCB unit comprising n segmental portions connected along a lengthwise direction of the flexible substrate strip;
   second, after the first step, forming the conductive layer of n−2 segmental portions of each PCB unit into traces with remaining two segmental portions left untreated without traces, in a reel to reel process;
   third, after the second step, cutting the flexible substrate strip into pieces along border lines between the PCB units to separate the PCB units from each other;
   fourth, after the third step, folding each PCB unit in such a manner that the n−2 segmental portions having traces are folded and sandwiched between the two segmental portions left untreated without traces;
   fifth, after the fourth step, laminating each folded PCB unit to form a plurality of laminated multilayer substrates; and
   sixth, after the fifth step, forming traces in the two segmental portions left untreated without traces.

9. The method of claim 8, wherein the step of forming the conductive layer n−2 segmental portions of each PCB unit into traces with remaining two segmental portions left untreated comprises:
   unwinding the flexible substrate strip from one spool;
   treating the unwound portion in between the spools such that the conductive layer of the n−2 segmental portions located between the spools are formed into the traces; and
   feeding and winding the treated unwound portion onto another spool.

10. The method of claim 8, wherein the n segmental portions have a same size.

11. The method of claim 10, wherein border lines between the n segmental portions are substantially parallel to each other and substantially perpendicular to a lengthwise direction of the flexible substrate strip, and the n segmental portions are folded along the border lines therebetween.

12. The method of claim 8, wherein the border lines between the PCB units are substantially parallel to each other and substantially perpendicular to a lengthwise direction of the flexible substrate strip.

13. The method of claim 8, wherein each of the segmental portions are folded in a manner such that the segmental portions are substantially parallel with each other.

14. The method of claim 8, wherein n−1 adhesive sheets are provided and each sandwiched between two adjacent segmental portions in the laminating step.

* * * * *